(12) United States Patent
Welna et al.

(10) Patent No.: US 10,705,280 B2
(45) Date of Patent: Jul. 7, 2020

(54) LIGHT SOURCE MODULE AND LIGHT SOURCE DEVICE

(71) Applicant: Sharp Kabushiki Kaisha, Osaka (JP)

(72) Inventors: Karl Peter Welna, Oxford (GB); Valerie Berryman-Bousquet, Oxford (GB); Koji Takahashi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 50 days.

(21) Appl. No.: 16/202,438

(22) Filed: Nov. 28, 2018

(65) Prior Publication Data

US 2020/0166687 A1 May 28, 2020

(51) Int. Cl.
*G02B 6/26* (2006.01)
*F21V 8/00* (2006.01)
*F21S 41/16* (2018.01)
*F21S 41/24* (2018.01)
*F21S 41/30* (2018.01)
*F21S 41/176* (2018.01)

(52) U.S. Cl.
CPC .............. *G02B 6/003* (2013.01); *F21S 41/16* (2018.01); *F21S 41/176* (2018.01); *F21S 41/24* (2018.01); *F21S 41/30* (2018.01); *G02B 6/005* (2013.01); *G02B 6/0038* (2013.01); *G02B 6/0055* (2013.01)

(58) Field of Classification Search
CPC .......... F21S 41/16; F21S 41/176; F21S 41/24; G02B 6/003; G02B 6/005; G02B 6/0038; G02B 6/0055
USPC ................................... 362/606, 84
See application file for complete search history.

(56) References Cited

U.S. PATENT DOCUMENTS

| 2013/0329442 | A1* | 12/2013 | Kishimoto | C09K 11/7774 362/510 |
| 2014/0168940 | A1* | 6/2014 | Shiomi | F21S 41/285 362/84 |
| 2017/0184778 | A1 | 6/2017 | Onda et al. | |
| 2018/0003357 | A1 | 1/2018 | Park | |
| 2019/0137064 | A1* | 5/2019 | Zozgornik | G02B 6/4286 |

FOREIGN PATENT DOCUMENTS

| CN | 106990607 | 7/2017 |
| JP | 2013-118054 | 6/2013 |
| JP | 2013-171623 | 9/2013 |
| JP | 2013-211252 | 10/2013 |
| JP | 2013-222552 | 10/2013 |
| WO | WO 2013081069 | 6/2013 |

\* cited by examiner

*Primary Examiner* — Karabi Guharay
(74) *Attorney, Agent, or Firm* — Renner, Otto, Boisselle & Sklar, LLP

(57) ABSTRACT

A light source module includes: a convergent beam generating unit which generates, based on a pump beam emitted from a light source, a convergent pump beam having a beam size that decreases as the convergent pump beam propagates; a light guide body inside which the convergent pump beam, having been generated by the convergent beam generating unit, propagates; an extraction part which causes the convergent pump beam, having propagated inside the light guide body, to exit from the light guide body; and a wavelength conversion element which converts a wavelength of the convergent pump beam, being incident on the wavelength conversion element through the extraction part, and emits, through the light guide body, the convergent pump beam whose wavelength has been converted.

16 Claims, 13 Drawing Sheets

LIGHT SOURCE MODULE AND LIGHT SOURCE DEVICE

TECHNICAL FIELD

The present invention relates to a light source module including a wavelength conversion element which converts a wavelength of a pump beam, having been emitted from a light source and having propagated inside a light guide body, and emits, through the light guide body, the pump beam whose wavelength has been converted. The present invention further relates to a light source device including such a light source module.

BACKGROUND ART

A light source module is known which employs a light guide body that guides, to a wavelength conversion element, a pump beam having been emitted from a light source and propagating inside the light guide body (Patent Literature 1, Patent Literature 2).

CITATION LIST

Patent Literature

[Patent Literature 1]
Japanese Patent Application Publication, Tokukai, No. 2013-171623
[Patent Literature 2]
Pamphlet of PCT International Publication No. WO2013/081069

SUMMARY OF INVENTION

Technical Problem

However, the light source module disclosed in each of Patent Literature 1 and Patent Literature 2 has a problem that the pump beam, having been emitted from the light source and propagating inside the light guide body, is uncontrollable and accordingly diverges. This problem relates to (i) the light guide body which guides the pump beam and (ii) the fact that the pump beam is extracted from the light guide body toward the wavelength conversion element which converts the pump beam into converted emission light, for example, white light.

Due to reciprocity of light rays, the converted emission light which is to exit from the light guide body at an angle equal to or greater than an angle at which the pump beam has entered the light guide body is reflected back into the light guide body and guided back toward the light source of the pump beam. The converted emission light which is reflected back into the light guide body is accounted to be a loss, and should be therefore minimized. Neither of Patent Literature 1 and Patent Literature 2 discloses how to reduce the loss of the converted emission light which is reflected back into the light guide body.

An object of an aspect of the present invention is to provide a light source module and a light source device each of which allows a reduction in converted emission light which is reflected back into a light guide body.

Solution to Problem

A light source module in accordance with an aspect of the present invention is a light source module including: a convergent beam generating unit which generates, based on a pump beam emitted from a light source, a convergent pump beam having a beam size that decreases as the convergent pump beam propagates; a light guide body inside which the convergent pump beam, having been generated by the convergent beam generating unit, propagates; an extraction part which causes the convergent pump beam, having propagated inside the light guide body, to exit from the light guide body; and a wavelength conversion element which converts a wavelength of the convergent pump beam, being incident on the wavelength conversion element through the extraction part, and emits, through the light guide body, the convergent pump beam whose wavelength has been converted.

A light source device in accordance with an aspect of the present invention is a light source device including: the light source module in accordance with an aspect of the present invention; and a reflector which reflects the convergent pump beam, having been emitted from the wavelength conversion element through the light guide body, so that a collimated beam is projected.

Advantageous Effects of Invention

According to an aspect of the present invention, it is possible to reduce converted emission light which is reflected back into a light guide body.

DESCRIPTION OF EMBODIMENTS

Embodiment 1

Figure 1:
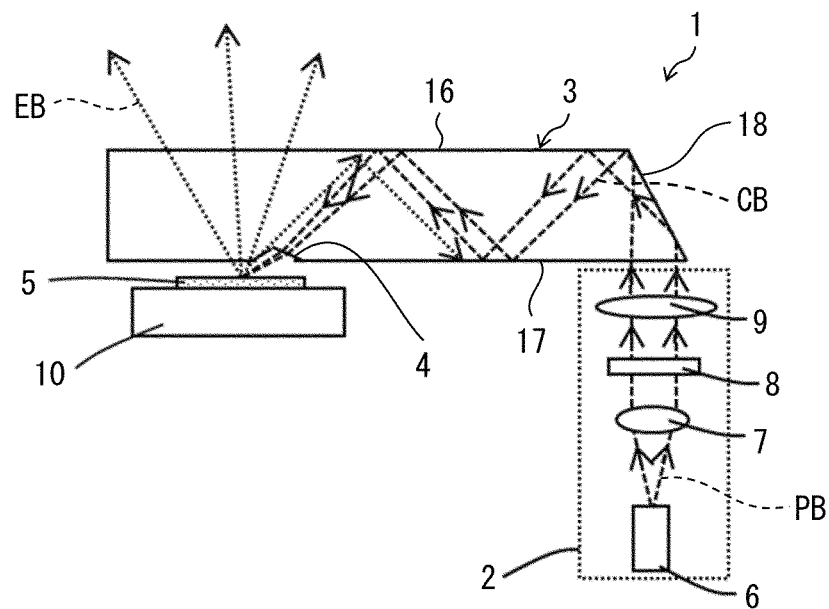
FIG. 1 is an elevational view of a light source module in accordance with Embodiment 1.
Figure 2:
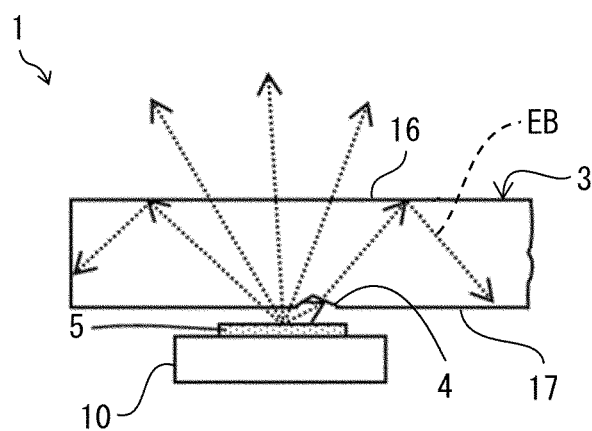
FIG. 2 is an elevational view illustrating how a converted emission beam, having been emitted from a phosphor included in the light source module, is emitted.
Figure 3:
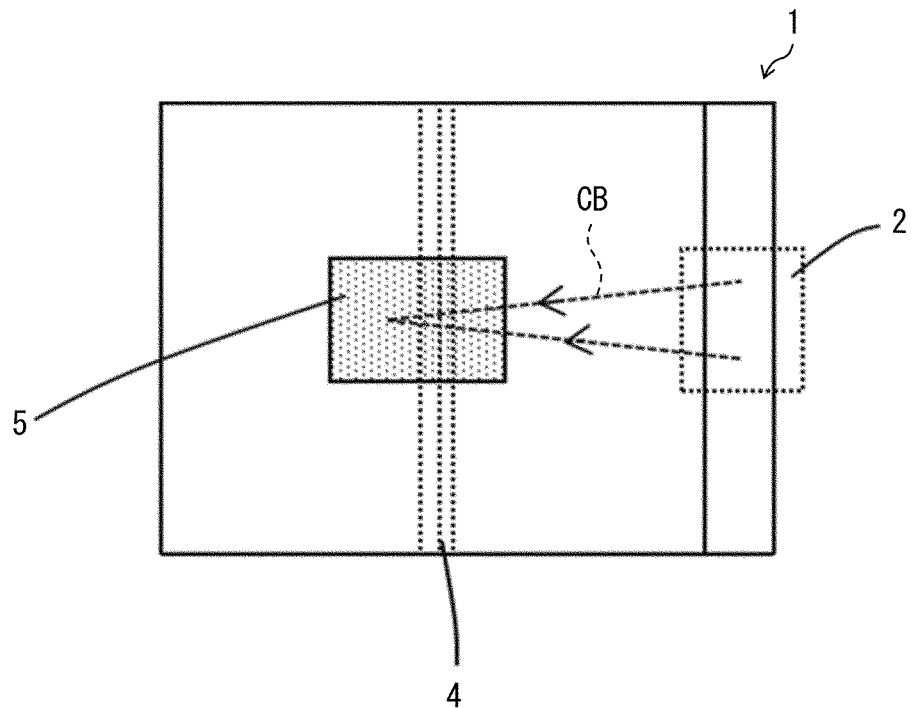
FIG. 3 is a plan view of the light source module.
Figure 4:
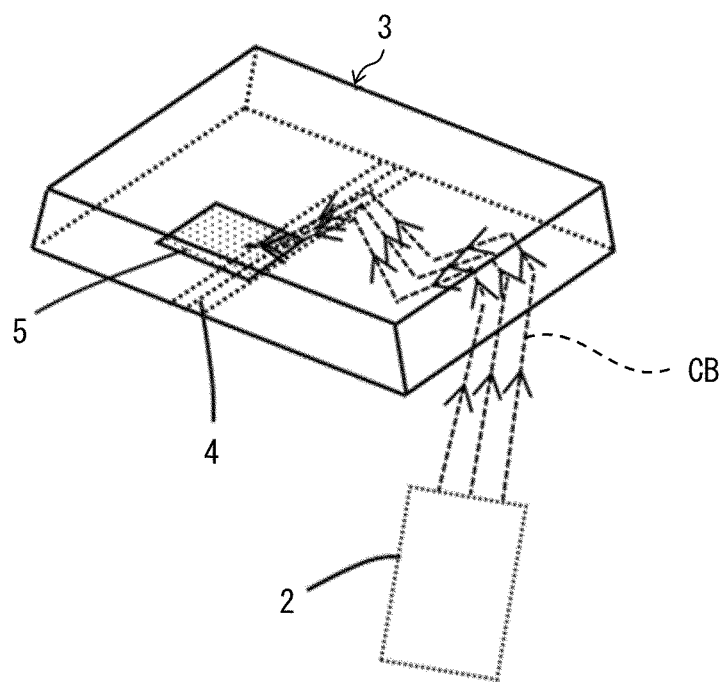
FIG. 4 is a perspective view of the light source module.

FIG. 1 is an elevational view of a light source module 1 in accordance with Embodiment 1. FIG. 2 is an elevational view illustrating how a converted emission beam EB, having been emitted from a phosphor 5 included in the light source module 1, is emitted. FIG. 3 is a plan view of the light source module 1. FIG. 4 is a perspective view of the light source module 1.

The light source module 1 includes a convergent beam generating unit 2. The convergent beam generating unit 2 generates, based on a pump beam PB, a convergent pump beam CB having a beam size which decreases as the convergent pump beam CB propagates. The convergent beam generating unit 2 includes (i) a semiconductor laser diode 6 (light source) which emits the pump beam PB, (ii) a collimation lens 7 which collimates the pump beam PB having been emitted from the semiconductor laser diode 6, (iii) a beam homogenizer 8 which homogenizes intensity distribution of the pump beam PB having passed through the collimation lens 7, and (iv) a converging lens 9 which generates the convergent pump beam CB on the basis of the pump beam PB having passed through the beam homogenizer 8.

The light source module 1 further includes a light guide body 3 which has a shape of a substantially flat plate and inside which the convergent pump beam CB, having been generated by the convergent beam generating unit 2, propagates. The light guide body 3 has (i) a bottom surface 17 through which the convergent pump beam CB, having been generated by the convergent beam generating unit 2, enters the light guide body 3 at a substantially right angle, (ii) a tilted surface 18 which totally reflects the convergent pump beam CB having entered the light guide body 3 through the bottom surface 17, and (iii) a top surface 16 which faces the bottom surface 17.

The light guide body 3 has, on the bottom surface 17, an extraction part 4 which causes the convergent pump beam CB, having propagated inside the light guide body 3, to exit from the light guide body 3. The extraction part 4 is constituted by a notch formed in the bottom surface 17 of the light guide body 3. The notch is made up of two tilted surfaces.

The light source module 1 includes the phosphor 5 (wavelength conversion element) which converts a wavelength of the convergent pump beam CB, being incident on the phosphor 5 through the extraction part 4, and emits, through the light guide body 3, the converted emission beam EB thus obtained. The phosphor 5 is arranged on a heat sink 10. The extraction part 4 refracts the convergent pump beam CB having propagated inside the light guide body 3, and causes the convergent pump beam CB to exit from the light guide body 3 so that the convergent pump beam CB is guided to the phosphor 5.

The semiconductor laser diode 6 emits the pump beam PB having a wavelength of, for example, 450 nm, and is of a CAN type or a chip type. The beam homogenizer 8 can be constituted by, for example, a microlens array so that a flat top profile of the pump beam PB is obtained. A position of the collimation lens 7 can be changed so that the convergent pump beam CB is generated without the need for the converging lens 9.

The light guide body 3 can be constituted by an optical glass. Each of the top surface 16 and the bottom surface 17 of the light guide body 3 can have a dielectric and metal coating. The convergent pump beam CB is coupled into the light guide body 3 and is guided to a side. The convergent pump beam CB can be reflected by the top surface 16 and the bottom surface 17 of the light guide body 3 via total internal reflection or via a highly reflective coating. Alternatively, the convergent pump beam CB can propagate without being reflected by top surface 16 and the bottom surface 17. The convergent pump beam CB propagating inside the light guide body 3 converges so that, for example, the beam size decreases. The convergent pump beam CB eventually strikes on the extraction part 4, and goes outside the light guide body 3. The convergent pump beam CB is refracted by the extraction part 4 (that is, a beam angle is changed), and propagates toward the phosphor 5.

The phosphor 5 can be a YAG:Ce phosphor or can be alternatively another phosphor. The phosphor 5 converts the convergent pump beam CB, having a shorter wavelength, into the converted emission beam EB, having a longer wavelength. A position of the phosphor 5 (that is, a horizontal distance and a vertical distance from the extraction part 4 and the light guide body 3 to the phosphor 5) is adjusted for optical efficiency. Ideally, an air gap is provided between the bottom surface 17 of the light guide body 3 and the phosphor 5. In a case where the convergent pump beam CB is incident on the phosphor 5, the convergent pump beam CB is converted into the converted emission beam EB. An angle at which the convergent pump beam CB is incident on the phosphor 5 is between 0° and 90°, preferably between 45° and 65°.

As illustrated in FIG. 2, a majority of the converted emission beam EB is emitted through the light guide body 3. However, part of the converted emission beam EB is totally reflected back into the light guide body 3 by the top surface 16 of the light guide body 3, and propagates toward the convergent beam generating unit 2 (FIG. 1). The part of the converted emission beam EB, which part has been totally reflected back into the light guide body 3 by the top surface 16, is a loss, and causes a reduction in efficiency of the light source module 1. According to Embodiment 1, the convergent pump beam CB, having a beam size which decreases as the convergent pump beam CB propagates, is used. This causes a decrease in proportion of the part of the converted emission beam EB, which part returns into the light guide body 3. Therefore, the efficiency of the light source module 1 is improved.

Figure 5A:
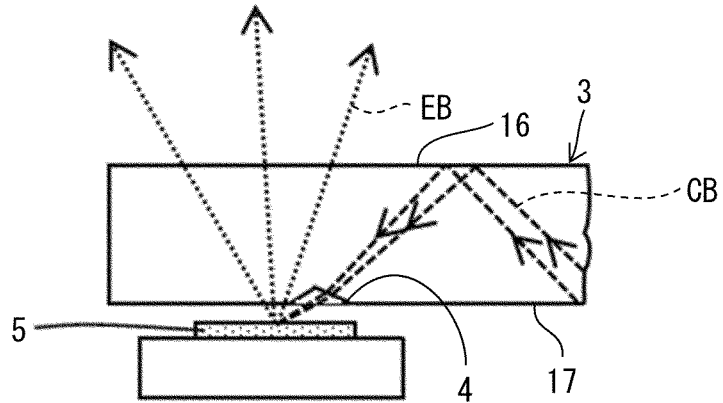
FIG. 5A is an elevational view illustrating an aspect of an extraction part included in the light source module.
Figure 5B:
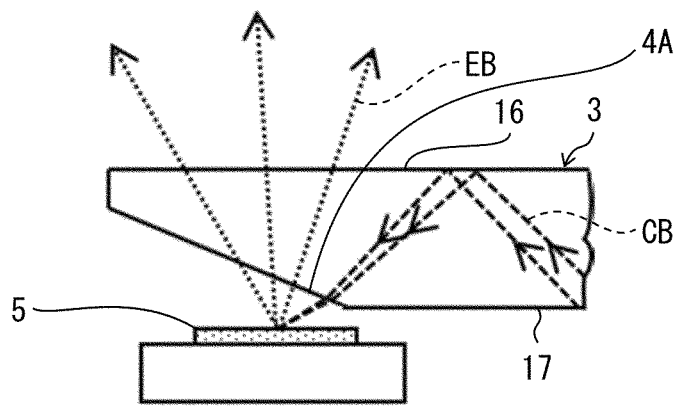
FIG. 5B is an elevational view illustrating an aspect of another extraction part included in the light source module.

FIG. 5A is an elevational view illustrating an aspect of the extraction part 4 included in the light source module 1. FIG. 5B is an elevational view illustrating an aspect of an extraction part 4A included in the light source module 1. Note that constituent elements which have been described above are given respective identical reference numerals. Detailed descriptions of such constituent elements will not be repeated. The same applies to the later described drawings.

Each of the extraction parts 4 and 4A is constituted by a notch in a subtractive manner which notch is obtained by removing part of the bottom surface 17 of the light guide body 3 so that the convergent pump beam CB is refracted (see FIGS. 5A and 5B). As illustrated in FIG. 5A, the convergent pump beam CB is refracted by passing through the extraction part 4, and is converted into the converted emission beam EB by the phosphor 5. The converted emission beam EB enters the light guide body 3 through the bottom surface 17 and exits from the light guide body 3 through the top surface 16. Alternatively, as illustrated in FIG. 5B, the above configuration can be arranged as follows. That is, the convergent pump beam CB is refracted by passing through the extraction part 4A, and is converted into the converted emission beam EB by the phosphor 5. The converted emission beam EB enters the light guide body 3 through the extraction part 4A and exits from the light guide body 3 through the top surface 16.

Figure 6:
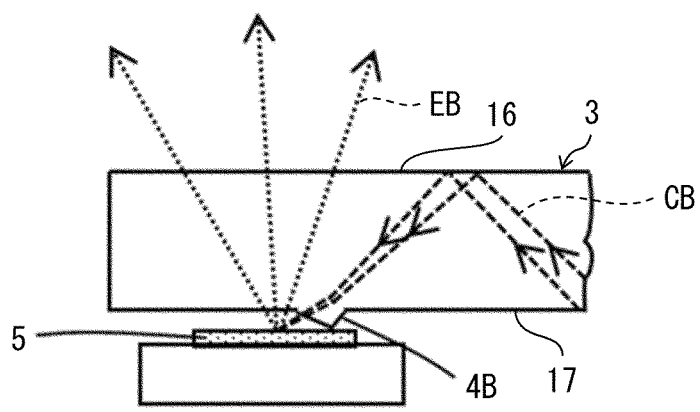
FIG. 6 is an elevational view illustrating an aspect of still another extraction part included in the light source module.

FIG. 6 is an elevational view illustrating an aspect of an extraction part 4B included in the light source module 1. As illustrated in FIG. 6, the extraction part 4B can be employed instead of the extraction parts 4 and 4A. The extraction part 4B is constituted by a protrusion in an additive manner which protrusion protrudes from the bottom surface 17 of the light guide body 3.

Each of the extraction parts 4, 4 A, and 4B, each in the subtractive manner or the additive manner, can be additionally formed to the light guide body 3 by a secondary fabrication step (for example, machining or bonding). Alternatively, each of the extraction parts 4, 4 A, and 4B can be formed to the light guide body 3 in a primary fabrication step of fabricating (for example, molding) the light guide body 3.

Figure 7:
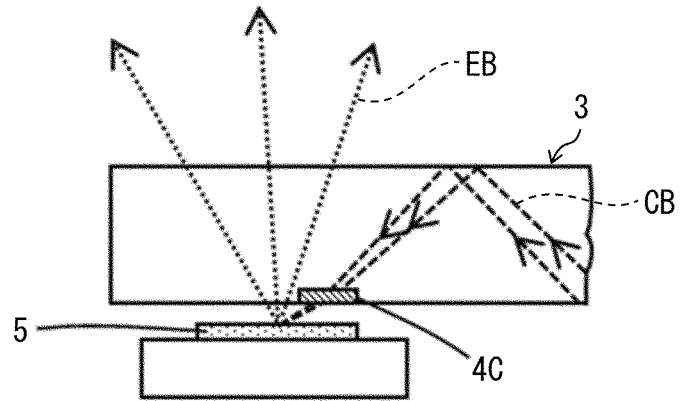
FIG. 7 is an elevational view illustrating an aspect of still another extraction part included in the light source module.

FIG. 7 is an elevational view illustrating an aspect of an extraction part 4C included in the light source module 1. The extraction part 4C is constituted by a grating. The extraction part 4C diffracts the convergent pump beam CB, having propagated inside the light guide body 3, so that the convergent pump beam CB is guided to the phosphor 5.

Figure 8:
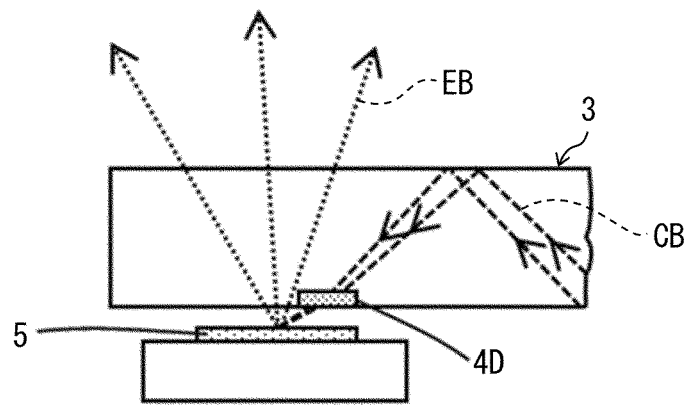
FIG. 8 is an elevational view illustrating an aspect of still another extraction part included in the light source module.

FIG. 8 is an elevational view illustrating an aspect of an extraction part 4D included in the light source module 1. The extraction part 4D has a surface which is randomly formed so that the convergent pump beam CB, having propagated inside the light guide body 3, is scattered. The extraction part 4D scatters the convergent pump beam CB, having propagated inside the light guide body 3, so that the convergent pump beam CB is guided to the phosphor 5.

Figure 9:
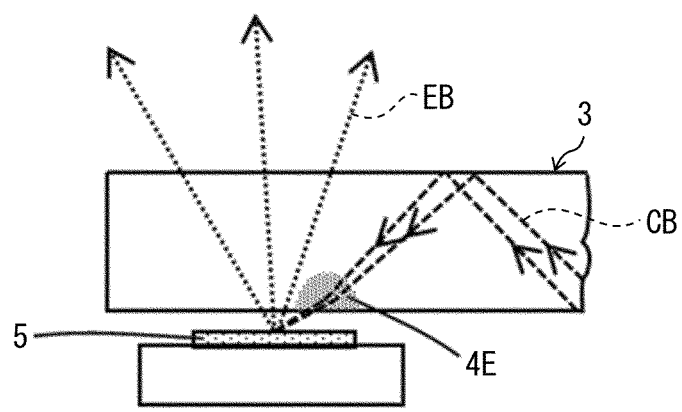
FIG. 9 is an elevational view illustrating an aspect of still another extraction part included in the light source module.

FIG. 9 is an elevational view illustrating an aspect of an extraction part 4E included in the light source module 1. The extraction part 4E is constituted by a region of the light guide body 3 which region has a refractive index different from that of the other region. The extraction part 4E refracts the convergent pump beam CB, having propagated inside the light guide body 3, so that the convergent pump beam CB is guided to the phosphor 5.

Figure 10:
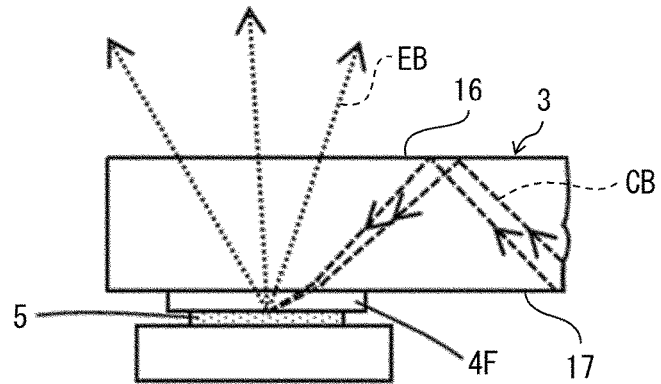
FIG. 10 is an elevational view illustrating an aspect of still another extraction part included in the light source module.

FIG. 10 is an elevational view illustrating an aspect of an extraction part 4F included in the light source module 1. The extraction part 4F is constituted by an intermediate layer provided between the light guide body 3 and the phosphor 5. The phosphor 5 is provided so that the extraction part 4F is sandwiched between the bottom surface of the light guide body 3 and the phosphor 5. The extraction part 4F refracts the convergent pump beam CB, having propagated inside the light guide body 3, so that the convergent pump beam CB is guided to the phosphor 5. The extraction part 4F can have a refractive index so that the efficiency of the light source module 1 is optimized.

Figure 11A:
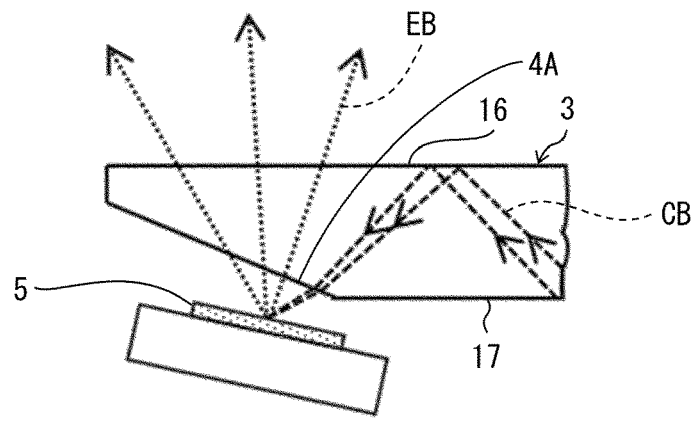
FIG. 11A is an elevational view illustrating other arrangement of the phosphor included in the light source module.

FIG. 11A is an elevational view illustrating other arrangement of the phosphor 5 included in the light source module 1. The phosphor 5 can be arranged so as to be tilted with respect to the bottom surface 17 of the light guide body 3 as illustrated in FIG. 11A. The convergent pump beam CB, having propagated inside the light guide body 3, is refracted by the extraction part 4A and is guided to the phosphor 5. The convergent pump beam CB is then converted into the converted emission beam EB. The converted emission beam EB is emitted from the phosphor 5, passes through the extraction part 4A, and exits from the light guide body 3 as illustrated in FIG. 11A.

Figure 11B:
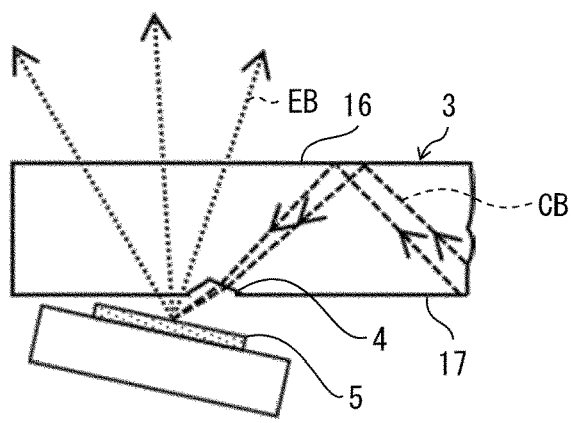
FIG. 11B is an elevational view illustrating still other arrangement of the phosphor included in the light source module.

FIG. 11B is an elevational view illustrating still other arrangement of the phosphor 5 included in the light source module 1. The phosphor 5 can be arranged so as to be tilted with respect to the bottom surface 17 of the light guide body 3 as illustrated in FIG. 11B. The convergent pump beam CB, having propagated inside the light guide body 3, is refracted by the extraction part 4 and is guided to the phosphor 5. The convergent pump beam CB is then converted into the converted emission beam EB. The converted emission beam EB is emitted from the phosphor 5, passes through the bottom surface 17 of the light guide body 3, and exits from the light guide body 3 as illustrated in FIG. 11B.

Figure 12A:
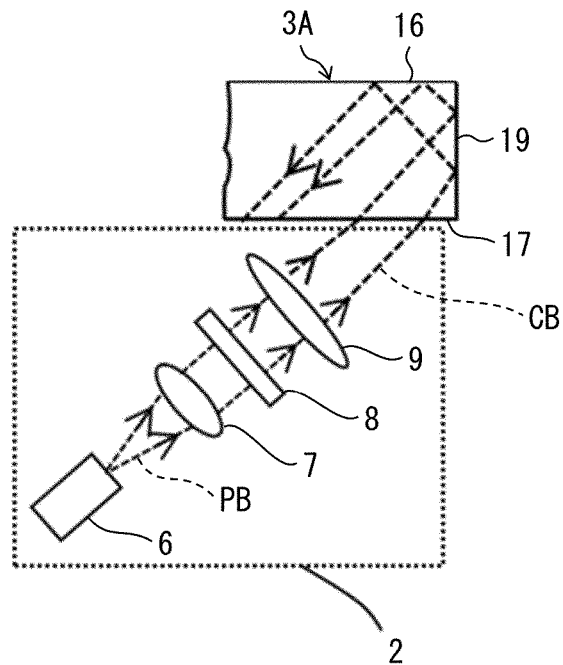
FIG. 12A is an elevational view illustrating another aspect of a convergent beam generating unit and a light guide body each included in the light source module.

FIG. 12A is an elevational view illustrating an aspect of the convergent beam generating unit 2 and a light guide body 3A each included in the light source module 1. The light guide body 3A has an end surface 19 which is perpendicular to each of a top surface 16 and a bottom surface 17. The convergent pump beam CB, having been emitted from the convergent beam generating unit 2, enters the light guide body 3A through the bottom surface 17. The convergent pump beam CB, having entered the light guide body 3A through the bottom surface 17, is totally reflected by the end surface 19 and is then reflected by the top surface 16. In this case, the convergent pump beam CB is favorably refracted by the bottom surface 17 of the light guide body 3A without the need for formation of an extraction part 4 which is tilted as illustrated in FIG. 1.

Figure 12B:
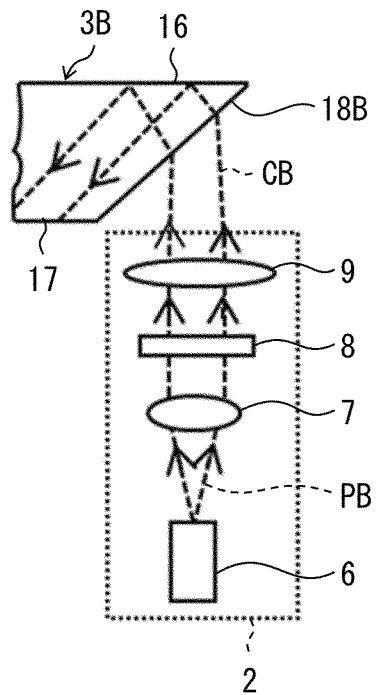
FIG. 12B is an elevational view illustrating still another aspect of the convergent beam generating unit and the light guide body each included in the light source module.

FIG. 12B is an elevational view illustrating an aspect of the convergent beam generating unit 2 and a light guide body 3B each included in the light source module 1. The light guide body 3B has a top surface 16, a bottom surface 17, and a tilted surface 18B which is located between the top surface 16 and the bottom surface 17 and which faces the convergent beam generating unit 2. The convergent pump beam CB is emitted, from the convergent beam generating unit 2, in a direction perpendicular to the bottom surface 17, and enters the light guide body 3B through the tilted surface 18B. The convergent pump beam CB is refracted by the tilted surface 18B, and is totally reflected by the top surface 16 toward the bottom surface 17 as with the case of an example illustrated in FIG. 1.

According to a configuration illustrated in each of FIGS. 12A and 12B, it is possible to correct distortion of a spot, on the phosphor 5, of the convergent pump beam CB which distortion is caused by the microlens array constituting the beam homogenizer 8 and by refraction based on an extraction part 4.

Figure 12C:
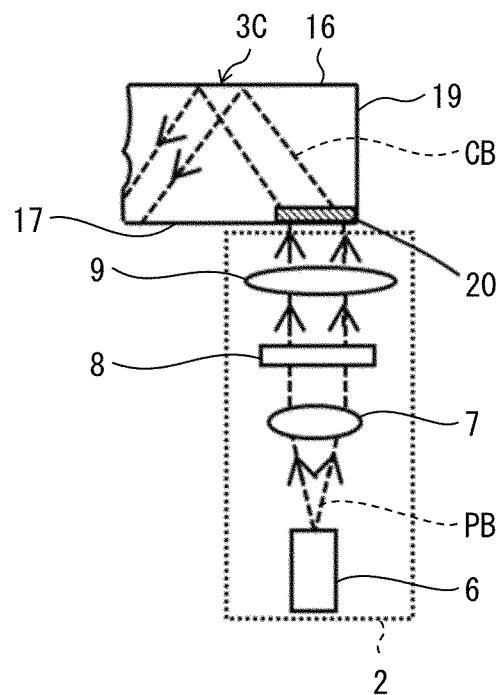
FIG. 12C is an elevational view illustrating still another aspect of the convergent beam generating unit and the light guide body each included in the light source module.

FIG. 12C is an elevational view illustrating an aspect of the convergent beam generating unit 2 and a light guide body 3C each included in the light source module 1. The light guide body 3C can have a grating 20 which is provided on a bottom surface 17 so as to face the convergent beam generating unit 2. The convergent pump beam CB, having been emitted from the convergent beam generating unit 2 toward the bottom surface 17 of the light guide body 3C, is diffracted by the grating 20 and is then totally reflected by a top surface 16 of the light guide body 3C toward the bottom surface 17 as with the case of the example illustrated in FIG. 1. It is thus possible to use diffraction based on an incoupling member, such as the grating 20, in order to change a direction of the convergent pump beam CB having entered the light guide body 3C.

Figure 13A:
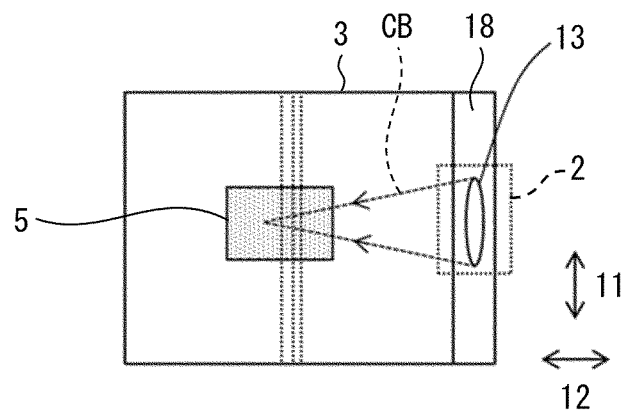
FIG. 13A is an elevational view illustrating an aspect of a fast axis of a semiconductor laser diode included in the light source module.
Figure 13B:
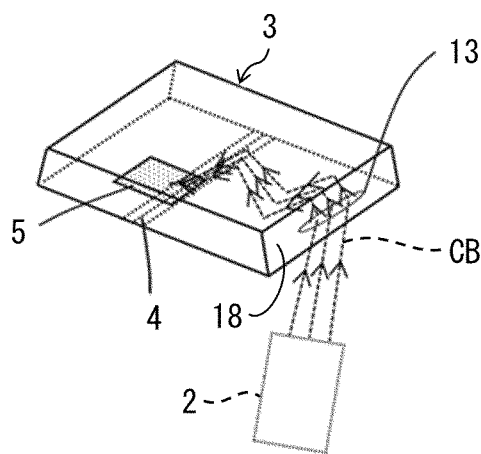
FIG. 13B is a perspective view illustrating the aspect of the fast axis of the semiconductor laser diode.

FIG. 13A is an elevational view illustrating an aspect of a fast axis 11 of the semiconductor laser diode 6 included in the light source module 1. FIG. 13B is a perspective view illustrating the aspect of the fast axis 11 of the semiconductor laser diode 6. The semiconductor laser diode 6 included in the convergent beam generating unit 2 typically has an elliptical pump beam profile 13 which indicates diffraction based on a width and a height used for a ridge-structure semiconductor laser diode. The fast axis 11 of the pump beam profile 13 of the semiconductor laser diode 6 (a direction of a ridge height, a divergence angle of the semiconductor laser diode 6), which fast axis 11 is perpendicular to a slow axis 12 of the pump beam profile 13 of the semiconductor laser diode 6, is preferably oriented along the tilted surface 18 of the light guide body 3 as illustrated in 13A. This makes it possible to reduce a height of the light guide body 3 and improve incoupling efficiency of the convergent pump beam CB into the light guide body 3.

Embodiment 2

Figure 14:
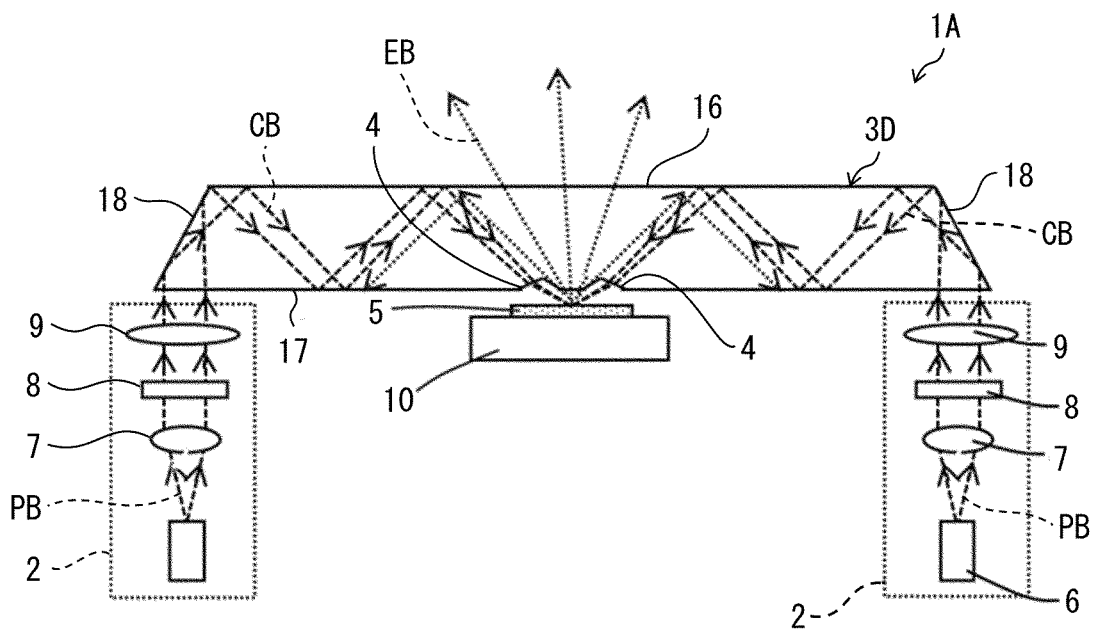
FIG. 14 is an elevational view of a light source module in accordance with Embodiment 2.
Figure 15:
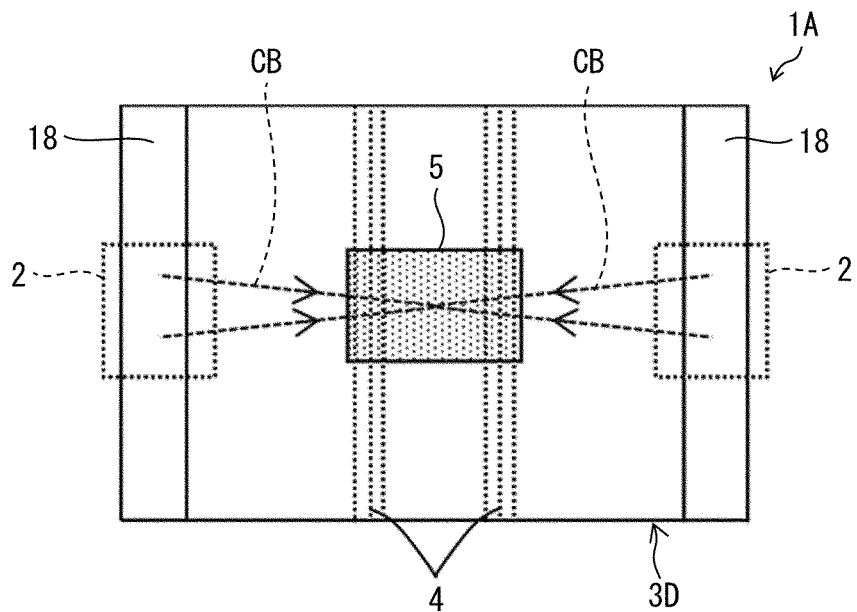
FIG. 15 is a plan view of the light source module.

FIG. 14 is an elevational view of a light source module 1A in accordance with Embodiment 2. FIG. 15 is a plan view of the light source module 1A. The above-described Embodiment 1 relates to a configuration in which merely a single convergent beam generating unit 2 is employed. An approach similar to that described in Embodiment 1 can be applied to a configuration in which a plurality of convergent beam generating units 2 are employed. A light guide body can be adopted in various ways so as to allow a plurality of convergent pump beams CB, having been emitted from the respective plurality of convergent beam generating units 2, to be incident on a phosphor 5. The plurality of convergent pump beams CB may or may not overlap with each other on the phosphor 5. The following examples show cases in which the plurality of convergent pump beams CB overlap with each other.

The light source module 1A includes two convergent beam generating units 2. The two convergent beam generating units 2 are arranged at respective positions which correspond to respective opposite ends of a light guide body 3D having a shape of a substantially thin rectangular parallelepiped. Two convergent pump beams CB, having been emitted from the respective two convergent beam generating units 2, enter the light guide body 3D through the respective opposite ends of light guide body 3D. The two convergent pump beams CB propagate inside the light guide body 3D, pass through respective two separate extraction parts 4, and are then incident on a phosphor 5.

An example in which the two separate extraction parts 4 are provided has been described, but the present invention is not limited to such an example. The light guide body 3D can have a single extraction part 4 as described in Embodiment 1.

Figure 16:
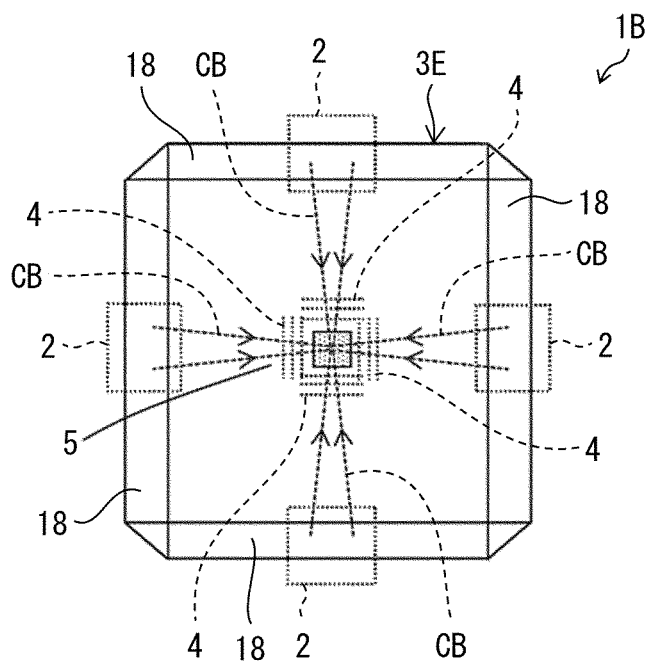
FIG. 16 is a plan view of another light source module in accordance with Embodiment 2.

FIG. 16 is a plan view of a light source module 1B in accordance with Embodiment 2. The light source module 1B includes four convergent beam generating units 2. The four convergent beam generating units 2 are arranged at respective positions which correspond to respective four side parts of a light guide body 3E having a shape of a substantially thin rectangular parallelepiped (see FIG. 16). The light guide body 3E has four separate extraction parts 4 which correspond to the respective four side parts.

An example in which the four separate extraction parts 4 are provided has been described, but the present invention is not limited to such an example. The light guide body 3E can have a single extraction part 4 as described in Embodiment 1.

Figure 17A:
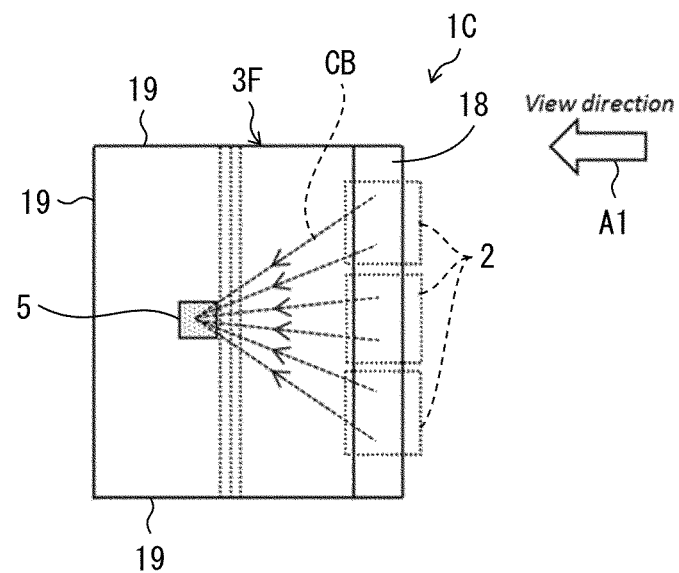
FIG. 17A is a plan view of still another light source module in accordance with Embodiment 2.
Figure 17B:
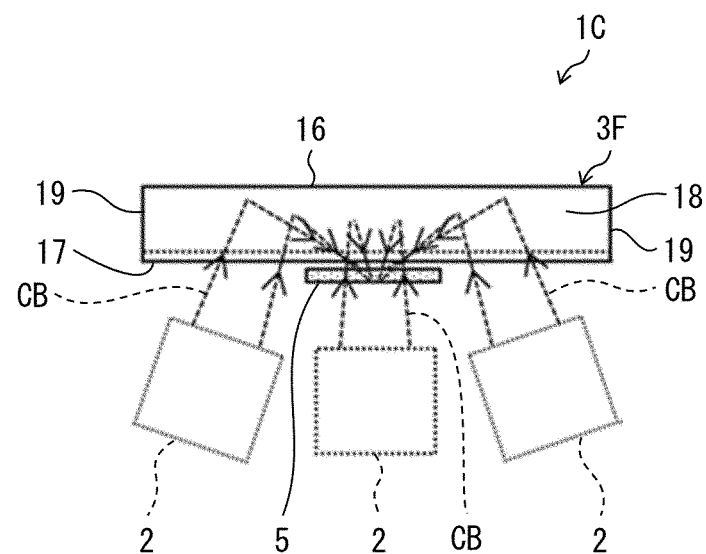
FIG. 17B is a side view of the still another light source module.

FIG. 17A is a plan view of a light source module 1C in accordance with Embodiment 2. FIG. 17B is a side view of the light source module 1C as viewed from a direction of an arrow A1 illustrated in FIG. 17A. The light source module 1C includes a light guide body 3F having a shape of a substantially thin rectangular parallelepiped. The light guide body 3F has a top surface 16, a bottom surface 17 which is parallel to the top surface 16, three end surfaces 19 which are perpendicular to the top surface 16 and the bottom surface 17, and a tilted surface 18 which is tilted with respect to the top surface 16 and the bottom surface 17. Three convergent beam generating units 2 are arranged at respective positions which correspond to the tilted surface 18. The three convergent beam generating units 2 are arranged so that three convergent pump beams CB, having been emitted from the respective three convergent beam generating units 2, overlap with each other on a phosphor 5. For example, a right one and a left one of the three convergent beam generating units 2 illustrated in FIG. 17B are arranged so as to be tilted with respect to a middle one of the three convergent beam generating units 2 as illustrated in FIG. 17B. Constituent elements included in each of the right one and the left one of the three convergent beam generating units 2 can be adjusted so that distortion of a convergent pump beam profile, which distortion is caused by such tilts, is compensated for.

Figure 18A:
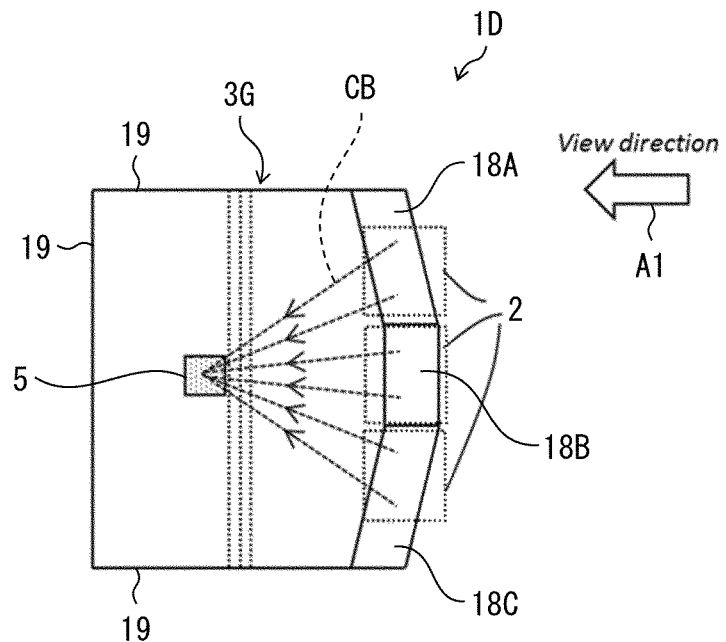
FIG. 18A is a plan view of still another light source module in accordance with Embodiment 2.
Figure 18B:
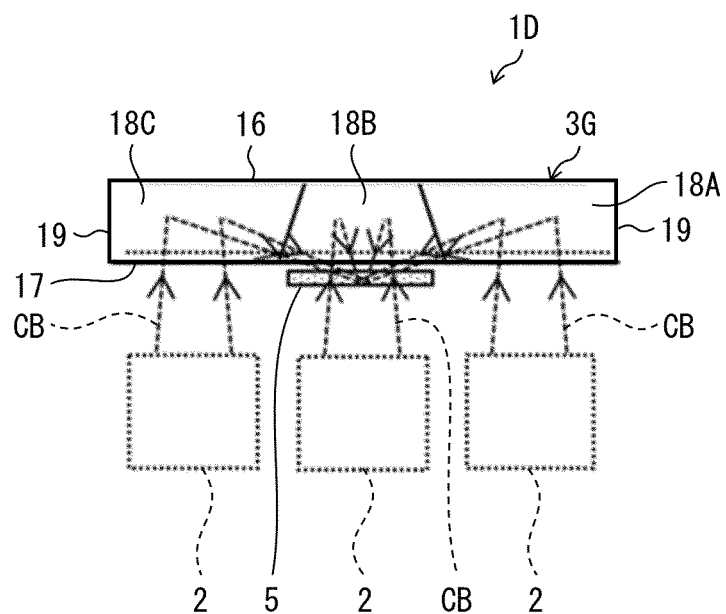
FIG. 18B is a side view of the still another light source module.

FIG. 18A is a plan view of a light source module 1D in accordance with Embodiment 2. FIG. 18B is a side view of the light source module 1D as viewed from a direction of an arrow A1 illustrated in FIG. 18A. The light source module 1D includes a light guide body 3G having a shape of a substantially thin rectangular parallelepiped. The light guide body 3G has a top surface 16, a bottom surface 17 which is parallel to the top surface 16, three end surfaces 19 which are perpendicular to the top surface 16 and the bottom surface 17, and tilted surfaces 18A, 18B, and 18C which are tilted in respective different manners with respect to the top surface 16 and the bottom surface 17. Three convergent beam generating units 2 are arranged at respective positions which correspond to the respective tilted surfaces 18A, 18B, and 18C. The three convergent beam generating units 2 are not tilted with respect to each other. The tilted surfaces 18A, 18B, and 18C of the light guide body 3G are arranged such that three convergent pump beams CB, having been emitted from the respective three convergent beam generating units 2, are refracted so that the three convergent pump beams CB may or may not overlap with each other on a phosphor 5.

In Embodiment 2, each of semiconductor laser diodes 6 is configured in a manner similar to that in Embodiment 1. That is, a fast axis 11 of each of the semiconductor laser diodes 6 is oriented as illustrated in FIG. 13A. Alternatively, the fast axis 11 and a slow axis 12 of each of the semiconductor laser diodes 6 may not be oriented. In this way, the semiconductor laser diodes 6 are individually electrically controlled so that blue scattering and conversion at the phosphor 5 are controlled and therefore color of a converted emission beam EB is controlled.

Embodiment 3

Figure 19A:
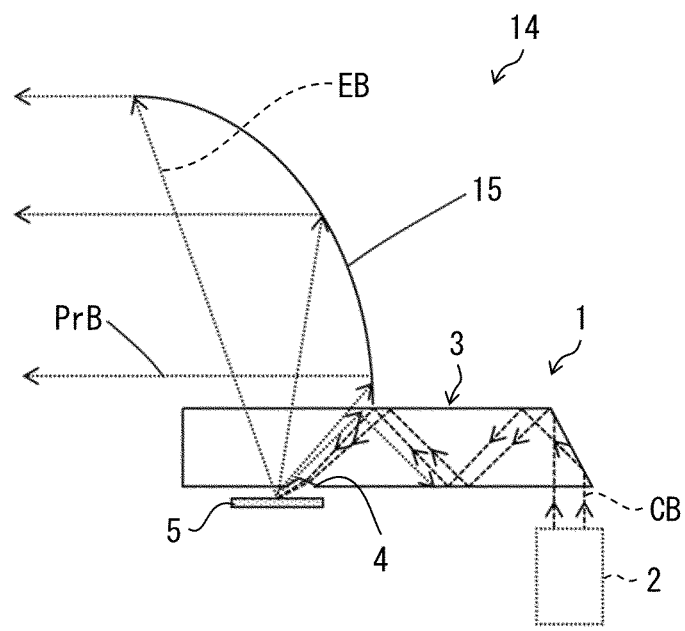
FIG. 19A is an elevational view of a light source device in accordance with Embodiment 3.
Figure 19B:
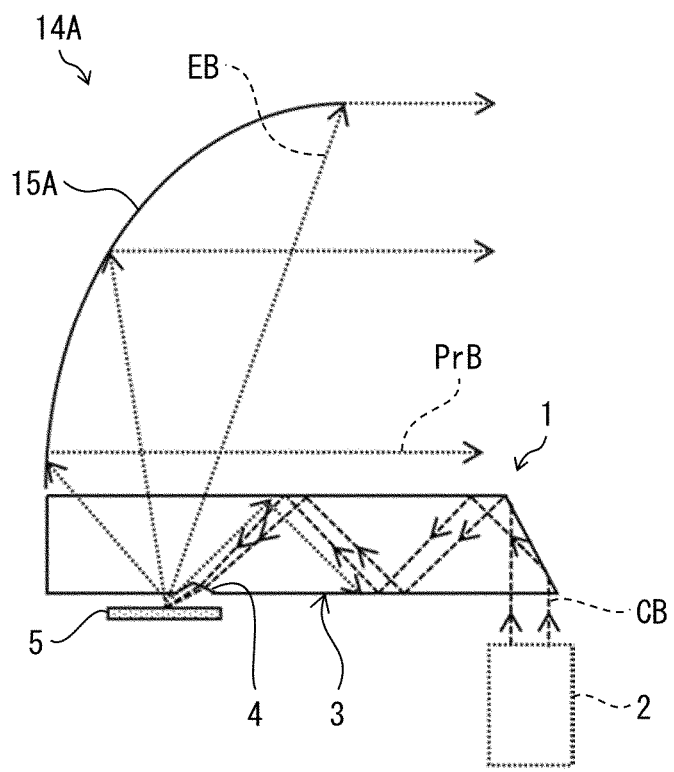
FIG. 19B is an elevational view of another light source device in accordance with Embodiment 3.
Figure 20:
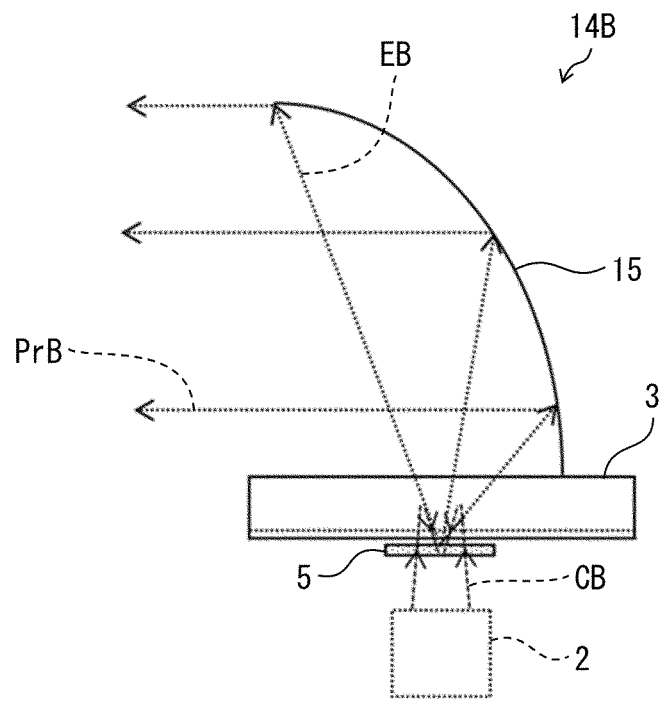
FIG. 20 is a side view of still another light source device in accordance with Embodiment 3.

FIG. 19A is an elevational view of a light source device 14 in accordance with Embodiment 3. FIG. 19B is an elevational view of a light source device 14A in accordance with Embodiment 3. FIG. 20 is a side view of a light source device 14B in accordance with Embodiment 3.

A light source module in accordance with each of Embodiments 1 and 2 can be used in combination with an optical component which collimates a converted emission beam EB or forms an image. Such an optical component can be a lens or a reflector. The reflector can be configured in different manners relative to a direction in which a convergent pump beam CB propagates.

The light source device 14 includes a light source module 1 and a reflector 15 which reflects a converted emission beam EB so that a projected converted emission beam PrB, which is collimated, is emitted. The reflector 15 causes the projected converted emission beam PrB to be emitted in a direction identical to a direction in which a convergent pump beam CB propagates inside a light guide body 3 (see FIG. 19A). The light source device 14A is configured such that a reflector 15A causes a projected converted emission beam PrB to be emitted in a direction opposite to a direction in which a convergent pump beam CB propagates inside a light guide body 3 (see FIG. 19B). The light source device 14B is configured such that a reflector 15 causes a projected converted emission beam PrB to be emitted in a direction perpendicular to a direction in which a convergent pump beam CB propagates inside a light guide body 3 (see FIG. 20).

FIGS. 19A, 19B, and 20 each illustrate a configuration in which a single convergent beam generating unit 2 is provided. However, the present invention is not limited to such a configuration. A configuration in which a plurality of convergent beam generating units 2 are provided can be employed.

Figure 21:
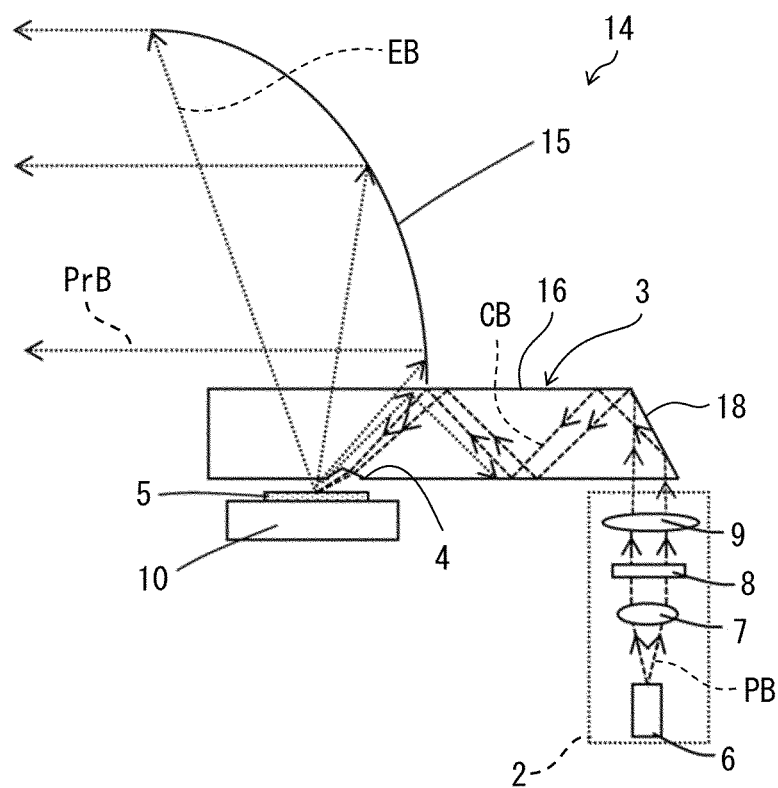
FIG. 21 is an elevational view of a light source device in accordance with Embodiment 3.

FIG. 21 is an elevational view of a light source device 14 in accordance with Embodiment 3. The light source device 14 includes a convergent beam generating unit 2, a light guide body 3, a phosphor 5, and a reflector 15. The light source device 14 can be used for a headlight of an automobile. The phosphor 5 is mounted on highly reflective metal so that this system operates in a reflective phosphor configuration.

A semiconductor laser diode 6 is configured such that a fast axis 11 is oriented along a tilted surface 18. The semiconductor laser diode 6 emits a pump beam PB having a wavelength of approximately 450 nm. The pump beam PB is collimated by a collimation lens 7, homogenized by a beam homogenizer 8 constituted by a microlens array, and focused, by a converging lens 9, at a distance that overlaps with a position of the phosphor 5.

A convergent pump beam CB is coupled into the light guide body 3 so that an angle (for example, 45°) at which the convergent pump beam CB is incident on a top surface 16 of the light guide body 3 is greater than a critical angle of reflection. The convergent pump beam CB is then totally reflected, and propagates inside the light guide body 3. The convergent pump beam CB is aligned so as to overlap with an extraction part 4 and exit. A tilted surface of the extraction part 4 is designed so that an amount of a converted emission beam EB which goes back into the light guide body 3 is minimized. The convergent pump beam CB, having exited from the light guide body 3, is then incident on the phosphor 5. A position of the converging lens 9 is adjusted so that the convergent pump beam CB is focused on the phosphor 5. The convergent pump beam CB scatters, and the converted emission beam EB is generated. As a result, the converted emission beam EB, which is a white light beam, is emitted from the phosphor 5 toward the reflector 15 through the light guide body 3. The reflector 15 is a parabolic reflector which collimates the converted emission beam EB.

SUMMARY

In order to attain the above-described object, a light source module in accordance with an aspect of the present invention is a light source module including: a convergent beam generating unit which generates, based on a pump beam emitted from a light source, a convergent pump beam having a beam size that decreases as the convergent pump beam propagates; a light guide body inside which the convergent pump beam, having been generated by the convergent beam generating unit, propagates; an extraction part which causes the convergent pump beam, having propagated inside the light guide body, to exit from the light guide body; and a wavelength conversion element which converts a wavelength of the convergent pump beam, being incident on the wavelength conversion element through the extraction part, and emits, through the light guide body, the convergent pump beam whose wavelength has been converted.

The light source module in accordance with an aspect of the present invention is preferably arranged such that: the light source includes a semiconductor laser diode; and the convergent beam generating unit includes: a collimation lens which collimates the pump beam having been emitted from the semiconductor laser diode; a beam homogenizer which homogenizes intensity distribution of the pump beam having passed through the collimation lens; and a converging lens which generates the convergent pump beam on the basis of the pump beam having passed through the beam homogenizer.

The light source module in accordance with an aspect of the present invention is preferably arranged such that: the light guide body has a top surface and a bottom surface, the top surface being a surface through which the convergent pump beam, having been emitted from the wavelength conversion element, exits from the light guide body, the bottom surface being a surface through which the convergent pump beam, having been emitted from the wavelength conversion element, enters the light guide body; and the extraction part is designed so that the convergent pump beam, which has been emitted from the wavelength conversion element and which is totally reflected back into the light guide body by the top surface, is reduced.

The light source module in accordance with an aspect of the present invention is preferably arranged such that the extraction part refracts, diffracts, or scatters the convergent pump beam, having propagated inside the light guide body, so as to cause the convergent pump beam to exit from the light guide body.

The light source module in accordance with an aspect of the present invention is preferably arranged such that the extraction part includes an intermediate layer which is provided between the light guide body and the wavelength conversion element and which has a specific refractive index.

The light source module in accordance with an aspect of the present invention is preferably arranged such that: the light guide body has a top surface and a bottom surface, the top surface being a surface through which the convergent pump beam, having been emitted from the wavelength conversion element, exits from the light guide body, the bottom surface being a surface through which the convergent pump beam, having been emitted from the wavelength conversion element, enters the light guide body; and the wavelength conversion element is arranged so as to be tilted with respect to the bottom surface.

The light source module in accordance with an aspect of the present invention is preferably arranged such that the convergent pump beam, having been generated by the convergent beam generating unit, is refracted, diffracted, or scattered so as to enter the light guide body.

The light source module in accordance with an aspect of the present invention is preferably arranged such that the convergent beam generating unit is arranged so as to be tilted with respect to the light guide body.

The light source module in accordance with an aspect of the present invention is preferably arranged such that the semiconductor laser diode is arranged so that a fast axis of the semiconductor laser diode is oriented in a width direction which is perpendicular to a direction in which the convergent pump beam propagates.

The light source module in accordance with an aspect of the present invention is preferably arranged so as to further include another convergent beam generating unit which generates, based on another pump beam emitted from another light source, another convergent pump beam having a beam size that decreases as the another convergent pump beam propagates.

The light source module in accordance with an aspect of the present invention is preferably arranged such that the convergent beam generating unit and the another convergent beam generating unit are arranged so that the convergent pump beam and the another convergent pump beam enter the light guide body through a single side surface of the light guide body or through respective different side surfaces of the light guide body.

The light source module in accordance with an aspect of the present invention is preferably arranged such that the light guide body, the convergent beam generating unit, and the another convergent beam generating unit are arranged so that the convergent pump beam and the another convergent pump beam overlap with each other on the wavelength conversion element.

A light source device in accordance with an aspect of the present invention is a light source device including: the light source module in accordance with an aspect of the present invention; and a reflector which reflects the convergent pump beam, having been emitted from the wavelength conversion element through the light guide body, so that a collimated beam is projected.

The light source device in accordance with an aspect of the present invention is preferably arranged such that a direction in which the convergent pump beam propagates inside the light guide body is identical to a direction in which the collimated beam is projected from the reflector.

The light source device in accordance with an aspect of the present invention is preferably arranged such that a direction in which the convergent pump beam propagates inside the light guide body is opposite to a direction in which the collimated beam is projected from the reflector.

The light source device in accordance with an aspect of the present invention is preferably arranged such that a direction in which the convergent pump beam propagates inside the light guide body is perpendicular to a direction in which the collimated beam is projected from the reflector.

The present invention is not limited to the embodiments, but can be altered by a skilled person in the art within the scope of the claims. The present invention also encompasses, in its technical scope, any embodiment derived by combining technical means disclosed in differing embodiments. Further, it is possible to form a new technical feature by combining the technical means disclosed in the respective embodiments.

REFERENCE SIGNS LIST

1 Light source module
2 Convergent beam generating unit
3 Light guide body
4 Extraction part
5 Phosphor (wavelength conversion element)
6 Semiconductor laser diode (light source)
7 Collimation lens
8 Beam homogenizer
9 Converging lens
10 Heat sink
11 Fast axis
12 Slow axis
14 Light source device
15 Reflector
PB Pump beam
CB Convergent pump beam
EB Converted emission beam
PrB Projected converted emission beam

The invention claimed is:

1. A light source module comprising:
a convergent beam generating unit which generates, based on a pump beam emitted from a light source, a convergent pump beam having a beam size that decreases as the convergent pump beam propagates;
a light guide body inside which the convergent pump beam, having been generated by the convergent beam generating unit, propagates;
an extraction part which causes the convergent pump beam, having propagated inside the light guide body, to exit from the light guide body; and
a wavelength conversion element which converts a wavelength of the convergent pump beam, being incident on the wavelength conversion element through the extraction part, and emits, through the light guide body, the convergent pump beam whose wavelength has been converted.

2. The light source module as set forth in claim 1, wherein:
the light source includes a semiconductor laser diode; and
the convergent beam generating unit includes:
a collimation lens which collimates the pump beam having been emitted from the semiconductor laser diode;

a beam homogenizer which homogenizes intensity distribution of the pump beam having passed through the collimation lens; and a converging lens which generates the convergent pump beam on the basis of the pump beam having passed through the beam homogenizer.

3. The light source module as set forth in claim 2, wherein the semiconductor laser diode is arranged so that a fast axis of the semiconductor laser diode is oriented in a width direction which is perpendicular to a direction in which the convergent pump beam propagates.

4. The light source module as set forth in claim 1, wherein:

the light guide body has a top surface and a bottom surface, the top surface being a surface through which the convergent pump beam, having been emitted from the wavelength conversion element, exits from the light guide body, the bottom surface being a surface through which the convergent pump beam, having been emitted from the wavelength conversion element, enters the light guide body; and the extraction part is designed so that the convergent pump beam, which has been emitted from the wavelength conversion element and which is totally reflected back into the light guide body by the top surface, is reduced.

5. The light source module as set forth in claim 1, wherein the extraction part refracts, diffracts, or scatters the convergent pump beam, having propagated inside the light guide body, so as to cause the convergent pump beam to exit from the light guide body.

6. The light source module as set forth in claim 1, wherein the extraction part includes an intermediate layer which is provided between the light guide body and the wavelength conversion element and which has a specific refractive index.

7. The light source module as set forth in claim 1, wherein:

the light guide body has a top surface and a bottom surface, the top surface being a surface through which the convergent pump beam, having been emitted from the wavelength conversion element, exits from the light guide body, the bottom surface being a surface through which the convergent pump beam, having been emitted from the wavelength conversion element, enters the light guide body; and the wavelength conversion element is arranged so as to be tilted with respect to the bottom surface.

8. The light source module as set forth in claim 1, wherein the convergent pump beam, having been generated by the convergent beam generating unit, is refracted, diffracted, or scattered so as to enter the light guide body.

9. The light source module as set forth in claim 1, wherein the convergent beam generating unit is arranged so as to be tilted with respect to the light guide body.

10. The light source module as set forth in claim 1, further comprising another convergent beam generating unit which generates, based on another pump beam emitted from another light source, another convergent pump beam having a beam size that decreases as the another convergent pump beam propagates.

11. The light source module as set forth in claim 10, wherein the convergent beam generating unit and the another convergent beam generating unit are arranged so that the convergent pump beam and the another convergent pump beam enter the light guide body through a single side surface of the light guide body or through respective different side surfaces of the light guide body.

12. The light source module as set forth in claim 10, wherein the light guide body, the convergent beam generating unit, and the another convergent beam generating unit are arranged so that the convergent pump beam and the another convergent pump beam overlap with each other on the wavelength conversion element.

13. A light source device comprising:

the light source module recited in claim 1; and a reflector which reflects the convergent pump beam, having been emitted from the wavelength conversion element through the light guide body, so that a collimated beam is projected.

14. The light source device as set forth in claim 13, wherein a direction in which the convergent pump beam propagates inside the light guide body is identical to a direction in which the collimated beam is projected from the reflector.

15. The light source device as set forth in claim 13, wherein a direction in which the convergent pump beam propagates inside the light guide body is opposite to a direction in which the collimated beam is projected from the reflector.

16. The light source device as set forth in claim 13, wherein a direction in which the convergent pump beam propagates inside the light guide body is perpendicular to a direction in which the collimated beam is projected from the reflector.

* * * * *